(12) United States Patent
Ichinose et al.

(10) Patent No.: US 6,777,609 B2
(45) Date of Patent: Aug. 17, 2004

(54) THERMOELECTRIC CONVERSION MATERIAL AND THERMOELECTRIC CONVERSION DEVICE

(75) Inventors: Noboru Ichinose, Yokohama (JP); Shinsuke Arita, Zama (JP); Toshiaki Ueno, Yokohama (JP); Yuji Urano, Yokohama (JP)

(73) Assignee: Hokushin Corporation, Kanagawa (JP)

( * ) Notice: Subject to any disclaimer, the term of this patent is extended or adjusted under 35 U.S.C. 154(b) by 247 days.

(21) Appl. No.: 10/100,481

(22) Filed: Mar. 18, 2002

(65) Prior Publication Data

US 2002/0157699 A1 Oct. 31, 2002

(30) Foreign Application Priority Data

Mar. 19, 2001 (JP) .......................................... 2001-079013

(51) Int. Cl.⁷ ............................ H01L 35/12; H01B 1/02; C01D 1/02
(52) U.S. Cl. ................................ 136/236.1; 252/521.1; 423/594.6
(58) Field of Search ................................ 136/200, 201, 136/203, 205, 236.1; 252/519.1, 521.1; 423/594.6

(56) References Cited

U.S. PATENT DOCUMENTS 6,376,763 B2 * 4/2002 Funahashi et al. .......... 136/201

FOREIGN PATENT DOCUMENTS

JP 9321346 12/1997
JP 200021197 8/2000

OTHER PUBLICATIONS

Soviet Physics Solid State Physics. L.D. Dudkin and N.Kh.Abriko Sov., *On the Doping of the Semiconductor Compound Co $Sb_3$.*, pp. 126–133. 1959.

Soviet Physics Solid State Physics, B.N. Zobrina and L.D. Dudkin, *Investigation of the Thermoelectric Properties of Co $Sb_3$ with Sn, Te, and Ni Impurites*, pp. 1668–1674. 1960.

American Institute of Physics, K. Matsubara, T. Iyanaga, T. Tsubouchi, K.Kishimoto and T. Koyanagi., *Thermoelectric Properties of (Pd,Co)$Sb_3$ Compounds with Skutterudite Structure*, pp. 226–229. 1995.

* cited by examiner

*Primary Examiner*—Carol Chaney
*Assistant Examiner*—Thomas H. Parsons
(74) *Attorney, Agent, or Firm*—Huntley & Associates, LLC

(57) ABSTRACT

The invention provides a thermoelectric conversion material which is low toxic and can be used at a high temperature of 500° C. or higher without variation in performance, and a thermoelectric conversion device containing the material. The thermoelectric conversion material is formed of an oxide represented by $(Ca_{3-x}M_x)Co_4O_9$ (M: Sr or Ba, 1.2>x>0.5).

4 Claims, 5 Drawing Sheets

THERMOELECTRIC CONVERSION MATERIAL AND THERMOELECTRIC CONVERSION DEVICE

BACKGROUND OF THE INVENTION

1. Field of the Invention

The present invention relates to a thermoelectric conversion material to be employed at high temperature for so-called thermoelectric conversion (i.e., direct energy conversion without use of any movable parts), including power generation on the basis of Seebeck effect and electronic freezing on the basis of Peltier effect. The invention also relates to a thermoelectric conversion device containing the material.

2. Background Art

Thermoelectric conversion by use of a thermoelectric conversion material; e.g., thermoelectric power generation or electronic freezing, finds utility in a simplified direct-energy-conversion apparatus having no movable parts that generate vibration, noise, wear, etc.; having a simple, reliable structure; having a long service life; and facilitating maintenance. Thus, thermoelectric conversion is suitable for direct generation of DC power without combustion of a variety of fossil fuels or other sources and for temperature control without use of a cooling medium.

Characteristics of thermoelectric conversion materials are evaluated on the bases of power factor (Q) and figure of merit (Z), which are represented by the following formulas:

$$Q = \sigma \alpha^2 \qquad [\text{Formula 1}]$$

$$Z = \frac{\sigma \alpha^2}{\kappa} \qquad [\text{Formula 2}]$$

wherein $\alpha$ represents Seebeck coefficient; $\sigma$ represents electric conductivity; and $\kappa$ represents thermal conductivity. Thermoelectric conversion materials are desired to have a high figure of merit (Z); i.e., a high Seebeck coefficient ($\alpha$), high electric conductivity ($\sigma$), and low thermal conductivity ($\kappa$).

For example, when employed for thermoelectric conversion such as thermoelectric power generation, a thermoelectric conversion material is desired to have a figure of merit as high as $Z = 3 \times 10^{-3}$ 1/K or higher and to operate without variation for a long period of time under varying operation conditions. Mass production of thermoelectric power generators for use in vehicles or employing discharged heat gives rise to demand for a thermoelectric conversion material which has sufficiently high heat resistance and strength, particularly at high temperature, and resistance to deterioration in characteristics, as well as a method for producing the material at high efficiency and low cost.

Conventionally, PbTe or silicide materials including silicide compounds such as $MSi_2$ (M: Cr, Mn, Fe, or Co) and mixtures thereof have been used to serve as the aforementioned thermoelectric conversion materials.

Sb compounds such as $TSb_3$ (T: Co, Ir, or Ru) have also been used. For example, there has been disclosed a thermoelectric material which comprises a material containing $CoSb_3$ as a predominant component and an impurity added for determination of conduction type (L. D. Dudkin and N. Kh. Abriko Sov, Soviet Physics Solid State Physics (1959) p. 126; B. N. Zobrinaand, L. D. Dudkin, Soviet Physics Solid State Physics (1960) p. 1668; and K. Matsubara, T. Iyanaga, T. Tsubouchi, K. Kishimoto, and T. Koyanagi, American Institute of Physics (1995) p. 226–229).

Thermoelectric conversion materials formed of PbTe exhibit a high figure of merit (Z)—an index of thermoelectric properties—of approximately $1 \times 10^{-3}$ 1/K at about 400° C. However, the materials have a low melting point and poor chemical stability attributed to Te, a volatile component contained in the materials, and cannot be used at high temperature of 500° C. or higher. In addition, since cumbersome production steps are required due to presence of a volatile Te component in the materials, variation in product characteristics tends to be caused by variation in composition of the materials, failing to attain effective mass-production. Another disadvantage is that the raw materials for producing the thermoelectric conversion materials are expensive and highly toxic.

Silicide materials including silicide compounds such as $MSi_2$ (M: Cr, Mn, Fe, or Co) and mixtures thereof can be produced from inexpensive raw materials; contain no toxic components; are chemically stable; and can be used at temperatures of about 800° C. "Netsuden Handotai To Sono Oyo," authored by Kunio NISHIDA and Kin-ichi UEMURA, (1983) p. 176–180 (published by Nikkan Kogyo Shimbun) discloses a comparatively inexpensive method of producing these silicide materials. However, these silicide materials exhibit a thermoelectric property (e.g., a figure of merit (Z) of approximately $1-2 \times 10^{-4}$ 1/K) of about one-tenth that of PbTe and cannot provide sufficient thermoelectric properties comparable to those of PbTe.

Thermoelectric materials containing an Sb compound such as $TSb_3$ (T: Co, Ir, or Ru) as a predominant component (e.g., $CoSb_3$) are produced from non-toxic, comparatively inexpensive raw materials and are known to exhibit a comparatively high figure of merit ($<1 \times 10^{-3}$ 1/K).

In the production of a conventionally known thermoelectric conversion material having a chemical composition of $CoSb_3$, it is desirable that cubic $CoSb_3$ crystal phase is exclusively formed in the material to serve as a constitutional crystal phase, with other crystal phases ($CoSb$, $CoSb_2$, and $Sb$), which are detrimental to thermoelectric properties, being removed. However, in reality, when a production method involving melting $CoSb_3$ is employed, undesired phases ($CoSb$, $CoSb_2$, and $Sb$) other than $CoSb_3$ phase are precipitated during the course of solidification. In order to generate a crystal phase formed only of $CoSb_3$ from such a molten material, heat treatment at approximately 600° C. for about 200 hours is required, and such treatment disadvantageously prolongs the time required for production steps.

In addition, when a production method in which a solidified $CoSb_3$ melt is pulverized and sintered is applied, undesired phases ($CoSb$, $CoSb_2$) precipitated during solidification and having a higher density than that of $CoSb_3$ are transformed into $CoSb_3$ phase during firing. This phase transformation causes volume expansion, thereby disadvantageously inhibiting sintering. Specifically, sufficiently densified material has never been produced, even when pulverized $CoSb_3$ is hot-pressed at $5 \times 10^3$ kg/cm² and 600° C. (Reference: K. Matsubara, T. Iyanaga, T. Tsubouchi, K. Kishimoto, and T. Koyanagi, American Institute of Physics (1995) p. 226–229). The maximum density of the thus-sintered $CoSb_3$, reported in the reference, is 5.25 g/cm³, whereas the theoretical density of cubic $CoSb_3$ is 7.64 g/cm³. Thus, the sintered $CoSb_3$ is a considerably fragile material, and has poor strength at high temperature.

In order to attain satisfactory durability of a material formed of heavy elements such as Bi, Te, Se, and Pb against contact with industrial process discharge gas and to prevent vaporization of constitutional components in a high-temperature reaction atmosphere and contamination with the vaporized components, there has been desired a new material which can be produced at low cost; causes less environmental pollution; and can be used without causing variation even at high temperature.

In view of the foregoing, a strong tendency to use an oxide as a thermoelectric material has rapidly arisen. Generally, an oxide has low mobility and a typical carrier concentration of about $10^{19}$ cm$^{-3}$, exhibiting no conductivity, unlike a metal. Thus, it has been commonly accepted in the art that an oxide cannot serve as thermoelectric conversion material. However, in 1997, an oxide of layer structure, $NaCo_2O_4$, was surprisingly found to exhibit strong thermoelectromotive force despite its low resistivity (Japanese Patent Application Laid-Open (kokai) No. 2000-211971). Thermoelectric properties of this class of oxide are remarkably superior to those of other oxides, and approach those of existing thermoelectric material used in practice.

However, this oxide also has a drawback in that thermoelectric properties of products vary greatly in accordance with production conditions, due to sublimation of Na during sintering. In addition, when this oxide is used at high temperature, sublimation of Na disadvantageously deteriorates thermoelectric properties, and when the oxide is allowed to stand in air, resistivity problematically increases. Furthermore, Na is highly reactive to water contained in air, and the resultant reaction may deteriorate performance of products.

SUMMARY OF THE INVENTION

The present inventors have carried out extensive studies in order to solve the aforementioned problems, and have found a novel oxide thermoelectric conversion material. The present invention has been accomplished on the basis of this finding.

Thus, an object of the present invention is to provide a thermoelectric conversion material which has low toxicity and can be used at high temperature of 500° C. or higher without variation in performance. Another object of the present invention is to provide a thermoelectric conversion device containing the material.

Accordingly, in one aspect of the present invention, there is provided a thermoelectric conversion material formed of an oxide represented by $(Ca_{3-x}M_x)Co_4O_9$ (M: Sr or Ba, 1.2>x>0.5).

The oxide may be oriented along the C axis.

In another aspect of the invention, there is provided a thermoelectric conversion device containing the thermoelectric conversion material.

In still another aspect of the invention, there is provided a method of thermoelectric conversion comprising effecting thermoelectric conversion by use of a thermoelectric conversion material.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

DETAILED DESCRIPTION OF PREFERRED EMBODIMENTS

The thermoelectric conversion material of the present invention formed of an oxide represented by $Ca_3Co_4O_9$ in which a portion of Ca atoms are substituted by predetermined amounts of Sr atoms or Ba atoms. Thus, advantageously, the material is low-toxic and can be used at a temperature as high as 900° C. without substantial variation in performance.

Figure 1:
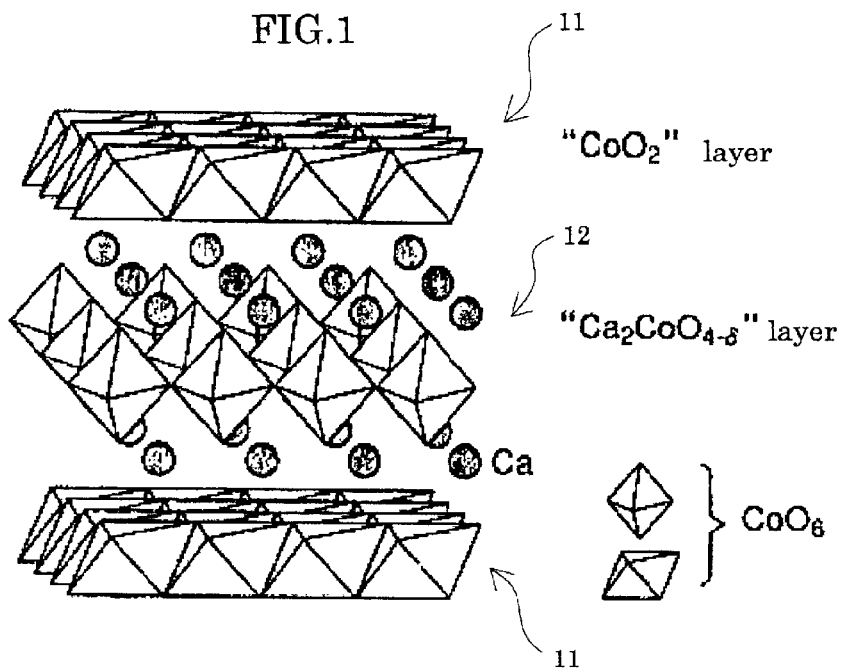
FIG. 1 is a schematic view of the crystal structure of a typical thermoelectric conversion material according to the present invention.

FIG. 1 shows the structure of the $(Ca_{3-x}M_x)Co_4O_9$ according to the present invention. As shown in FIG. 1, the oxide has a structure in which $CoO_2$ layers 11 and $Ca_2CoO_{4-\delta}$ layers 12 are alternately stacked. Each $CoO_2$ layer 11 consists of a plurality of $CoO_6$ octahedrons in which each boundary line is shared by adjacent octahedrons. Each $Ca_2CoO_{4-\delta}$ layer 12 consists of a plurality of $CoO_6$ octahedrons in which each apex is shared by two adjacent octahedrons. In the $Ca_2CoO_{4-\delta}$ layer 12, a portion of Ca atoms are substituted by Sr atoms or Ba atoms.

The thermoelectric conversion material of the present invention is formed of $(Ca_{3-x}M_x)Co_4O_9$, and the oxide has a layer structure in which $CoO_2$ layers 11 and $Ca_2CoO_{4-\delta}$ layers 12 are stacked. Each unit lattice has a plurality of crystallographically sites which are independent from one another, and presence of these sites enables provision of high electric conduction and low thermal conduction, attaining excellent thermoelectric properties. A more specific mechanism is conceived such that the sites forming the skeleton of the crystal structure form a band structure which determines electric conductivity and the other sites induce scattering of phonons relating to heat transportation, to thereby greatly reduce the effects of lattices on thermal conduction.

Although $NaCo_2O_4$, disclosed in Japanese Patent Application Laid-Open (kokai) No. 2000-211971, also has $CoO_2$ layers, the layer structure thereof comprises alternately stacked $CoO_2$ layers and Na-50%-deficient layers. Thus, this structure differs from that of the $(Ca_{3-x}M_x)Co_4O_9$ according to the present invention.

The $(Ca_{3-x}M_x)Co_4O_9$ which forms the thermoelectric conversion material of the present invention is preferably oriented along the C-axis. This is because thermoelectric properties are improved on the basis of anisotropy in physical properties, particularly electric resistivity, between the lateral direction and the perpendicular direction, the anisotropy being attributed to the aforementioned layer structure. Any known method such as hot-pressing or plasma discharge can be applied to effect orientation in the C-axis direction.

The $(Ca_{3-x}M_x)Co_4O_9$ which forms the thermoelectric conversion material of the present invention is also expected to provide large thermoelectromotive force and low resistivity. In other words, electron states similar to those of the heavy electron system are conceived to be realized in $Ca_3Co_4O_9$—an oxide of layered structure. In the oxide, a Hubbard band sustaining localized spin and a widened itinerant-electron band are present. When an interaction (magnitude of $k_B T_K$), called the Kondo effect, is applied between these two bands, coherent states having an energy gap of $k_B T_K$, which is electron states involving the interaction between these two bands, are formed. In such states, electrons move accompanying a spin wave and at a speed approximately as slow as that of the spin wave. Such electron states correspond to an increase in effective mass of an electron, and thermal electromotive force represented by $E_F/k_B T_K$ increases as shown in the below-shown formula (1). In addition, electrons are not scattered by the spin wave, and scattering time is prolonged, to thereby suppress resistivity. Thus, in the coherent state, particularly large thermal electromotive force and low resistivity are expected.

Among strong correlation electron system oxides, conduction in the $(Ca_{3-x}M_x)Co_4O_9$ which forms the thermoelectric conversion material of the present invention is conceived to be a type of hopping conduction of small polarons, and conductivity $\sigma$ and thermal electromotive force $\alpha$ are represented by the following formulas (2) to (4):

[formula 3]
$$Z = \frac{4Z_p Z_n}{\left(\sqrt{Z_p} + \sqrt{Z_n}\right)^2} \quad (1)$$

[formula 4]
$$\sigma = \left(\frac{C}{T}\right)\exp\left(-\frac{E}{kT}\right) \quad (2)$$

[formula 5]
$$C = \frac{r(1-r)e^2 a^2 Nv}{k} \quad (3)$$

[formula 6]
$$\alpha = \left(\frac{k}{e}\right)\text{Ln}\left\{\frac{2(1-r)}{r}\right\} \quad (4)$$

wherein E represents activation energy for causing hopping conduction; k represents Boltzmann constant; r represents the ratio of polaron density to density of sites available for hopping; e represents elementary electric charge; a represents inter-hopping-site spacing; N represents density of sites available for hopping; and v represents frequency of lattice vibration (optical mode). When hopping occurs among sites unequivalent to one another, a term proportional to temperature is appended to the right side of formula (4). Substances which allow hopping conduction; e.g., $Ca_3Co_4O_9$ are expected to attain greater thermal electromotive force and lower resistivity by reducing activation energy for causing hopping conduction or by increasing inter-hopping-site spacing through element substitution or other techniques.

The $(Ca_{3-x}M_x)Co_4O_9$ which forms the thermoelectric conversion material of the present invention exhibits excellent thermoelectric properties on the basis of substitution of predetermined amounts of calcium atoms occupying Ca sites in $Ca_3Co_4O_9$ by strontium atoms or barium atoms. This is conceived to be attributable to an increase in carrier mobility caused by substitution of calcium ions by strontium ions or barium ions having an ionic radius greater than that of calcium ion.

The degree of substitution of calcium ions, represented by x in $(Ca_{3-x}M_x)Co_4O_9$, preferably falls within the range of: 1.2>x>0.5. This is because when x is 1.2 or greater, a crystal phase formed only of a specific component cannot be formed and resistivity tends to increase, whereas when x is 0.5 or less, thermoelectric properties deteriorate.

No particular limitation is imposed on the element of atoms by which calcium ions are substituted, and any element can be used so long as the element enhances thermoelectric properties upon substitution of calcium ions. Other than Sr and Ba, elements such as Bi, La, and Y may be used.

By use of the thermoelectric conversion material of the present invention as described hereinabove, a thermoelectric conversion device providing excellent thermoelectric properties can be fabricated. The constitution of the device is not particularly limited, and any of conventionally known structures may be employed. For example, the device may be of a type in which electromotive force is obtained from the difference in temperature or a heat-pump for cooling or heating through application of electric power.

EXAMPLES

The present invention will next be described in detail by way of examples, which should not be construed as limiting the invention thereto.

Examples 1 and 2

$CaCO_3$ powder (purity: 99.99%), $Co_3O_4$ powder (purity: 99.9%), and $SrCO_3$ powder (purity: 99.9%) were weighed at proportions (stoichiometric composition) so as to attain x in $(Ca_{3-x}M_x)Co_4O_9$ of 0.75 (Example 1) or 1.0 (Example 2). The raw materials and $ZrO_2$ balls (diameter: 5 mm) were placed in a polypropylene-made container, and wet-mixed for 24 hours by use of ethanol as a dispersion medium. The resultant powder was dried and granulated by use of a sieve (mesh: 106 μm). Each granulated product sample (approximately 3 g) was compressed by use of a rectangular-press machine (preliminary compression at 250 kgf/cm² for 2 minutes and subsequent compression at 1,000 kgf/cm² for 5 minutes). The resultant compact was heated under oxygen at 5° C./min to 900° C. and fired at 900° C. for 10 hours, to thereby produce a sintered rod having a square cross-section (about 45 mm×3.4 mm×5 mm).

Examples 3 and 4

Each of the sintered products produced in Examples 1 and 2 was hot-pressed by means of a vacuum hot-press machine (product of Tokyo Shin-ku) and medium powder for two hours at 800° C. and 100,150 kg/cm², to thereby produce a sintered product.

Comparative Examples 1 to 3

The procedure of Example 1 was repeated, except that x in $(Ca_{3-x}M_x)Co_4O_9$ was changed to 0 (Comparative Example 1), 0.5 (Comparative Example 2), or 1.2 (Comparative Example 3), to thereby produce each sintered product.

Test Example 1

XRD Measurement

Each of the sintered products of Examples 1 to 4 and Comparative Examples 1 to 3 was identified through X-ray diffraction analysis by means of an analyzer (MXP³, product of Mac Science; Cu target). Measurement was performed under the following conditions:

Measurement range: 5.0–60.6 deg;

Sampling intervals: 0.02 deg;

Scanning speed: 3.0/min;

Measurement method: Typical method (without BG measurement);

Voltage generated: 40 kV;

Current generated: 30 mA;

Divergent slit: 1.0 deg;

Scatter slit: 1.0 deg; and

Emission slit: 0.15 mm.

Figure 2:
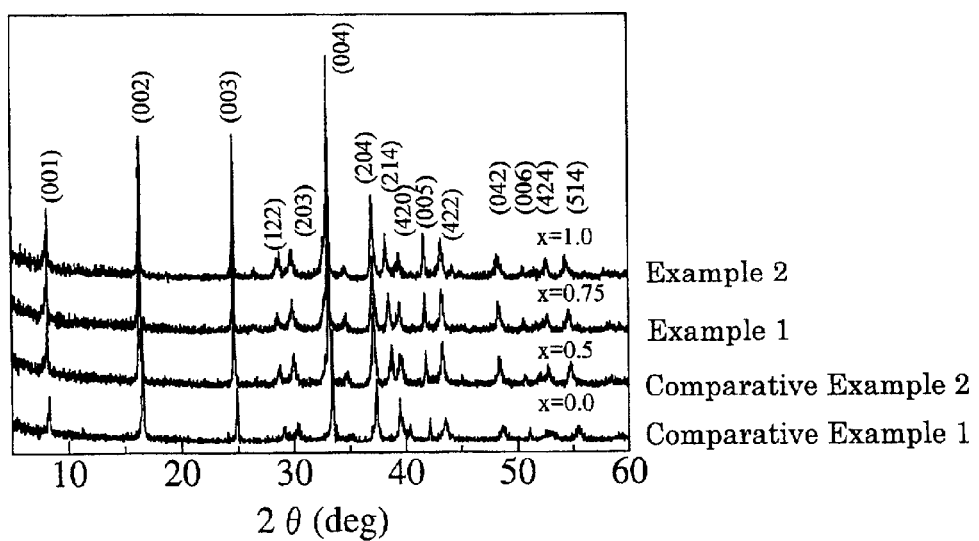
FIG. 2 is a chart showing X-ray diffraction patterns of thermoelectric conversion materials produced in accordance with Examples and Comparative Examples of the present invention.
Figure 3:
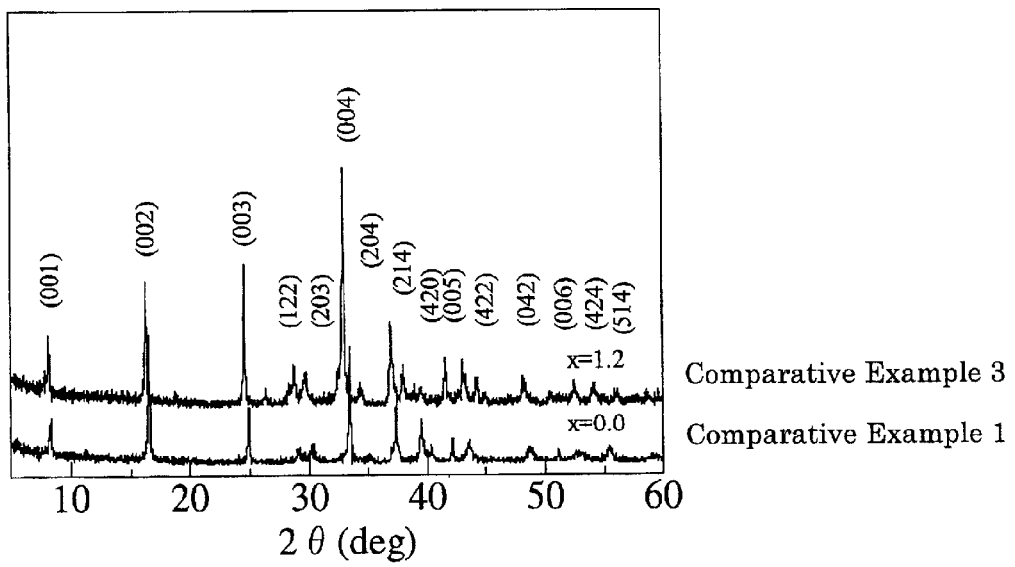
FIG. 3 is a chart showing X-ray diffraction patterns of thermoelectric conversion materials produced in accordance with Comparative Examples of the present invention.

FIGS. 2 and 3 show the results.

The results indicate that calcium cobalt oxides in which Ca atoms are partially substituted by Sr atoms and which have been produced in Examples 1 and 2 assume a crystal phase formed only of the corresponding oxide component. The results also have revealed that diffraction peaks were shifted to smaller in angle as the amount of Sr atoms increased. In the sample produced in Comparative Example 3 in which calcium atoms were excessively substituted by Sr atoms (x=1.2), no formation of a crystal phase formed only of a specific component was identified.

Test Example 2

Each of the sintered products of Examples 1 and 2 and Comparative Examples 1 and 2 was analyzed in terms of dependence of Seebeck coefficient on temperature. Measurement was performed in the following manner.

In the case of T<300 K

A test piece cut from each sample was fixed on two copper plates by use of a silver paste such that the test piece was brought into contact with both copper plates. While the test piece was gradually cooled from room temperature by use of liquid helium, temperature difference (ΔT, approximately 5 K) was induced between two fixation points of the test piece, by heating one copper plate by means of a heater connected to the copper plate, and the electromotive force was measured. Upon measurement, Cu, Cu-Ct, Cernox thermometer, and a strain gauge were employed as measuring wire, a thermocouple, a thermometer, and a heater, respectively.

In the case of T>300 K

The procedure of the above case (T<300 K) was repeated, except that temperature difference (ΔT, approximately 20 K) was induced between both ends of the test piece through employment of temperature gradient in a tube furnace that was provided by placing a heater at one end of the furnace.

Figure 4:
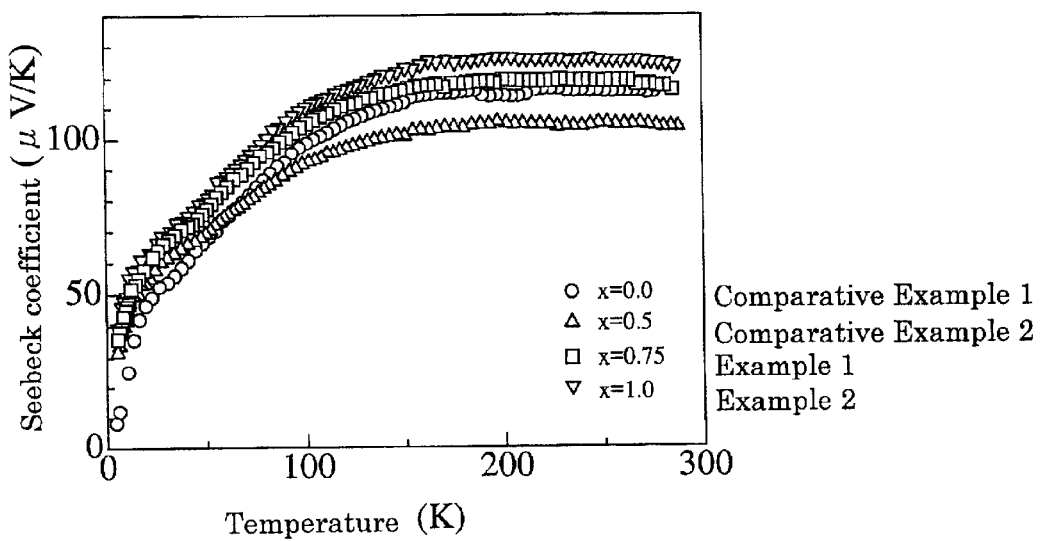
FIG. 4 is a graph showing temperature dependence of Seebeck characteristics, at low temperatures, of thermoelectric conversion materials produced in accordance with Examples and Comparative Examples of the present invention.
Figure 5:
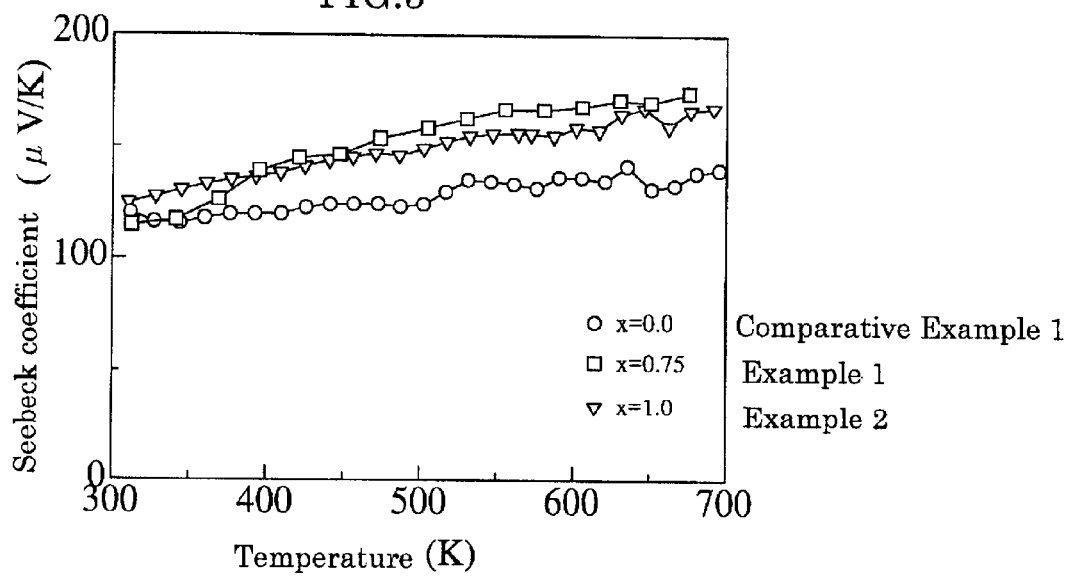
FIG. 5 is a graph showing temperature dependence of Seebeck characteristics, at high temperatures, of thermoelectric conversion materials produced in accordance with Examples and Comparative Examples of the present invention.

As shown in FIGS. 4 and 5, the samples of Examples 1 and 2 exhibited, both at low temperatures and high temperatures, a Seebeck coefficient higher than that of the sample of Comparative Example 1 formed of conventional $Ca_3Co_4O_9$. The Seebeck coefficient of the sample of Comparative Example 2 (x=0.5) was found to be lower than that of $Ca_3Co_4O_9$.

Test Example 3

Dependence of resistivity on temperature of each of the sintered products of Examples 1 and 2 and Comparative Examples 1 and 2 was measured through the DC four-probe method.

Figure 6:
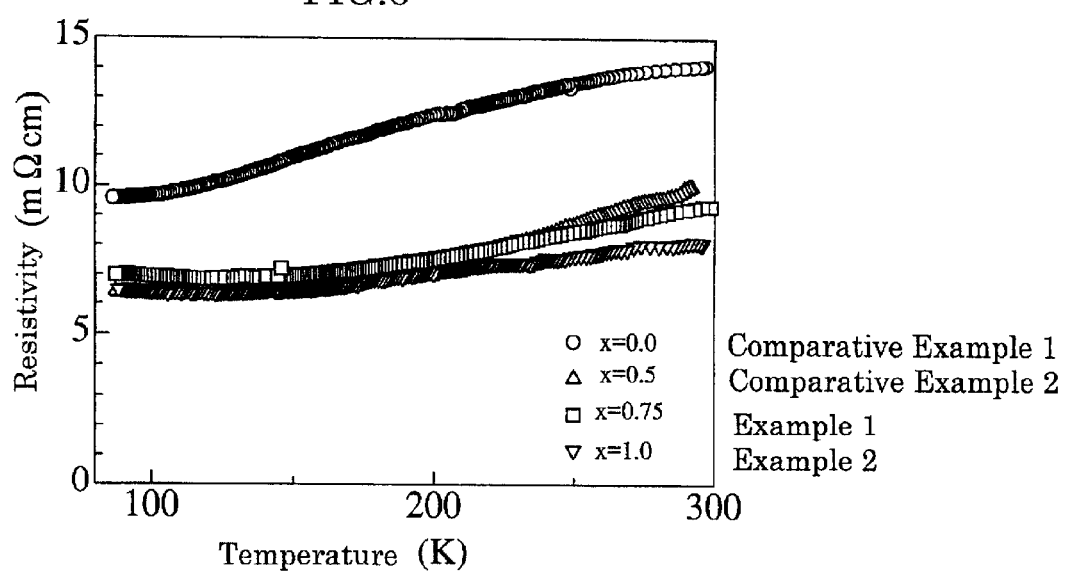
FIG. 6 is a graph showing temperature dependence of resistivity, at low temperatures, of thermoelectric conversion materials produced in accordance with Examples and Comparative Examples of the present invention.
Figure 7:
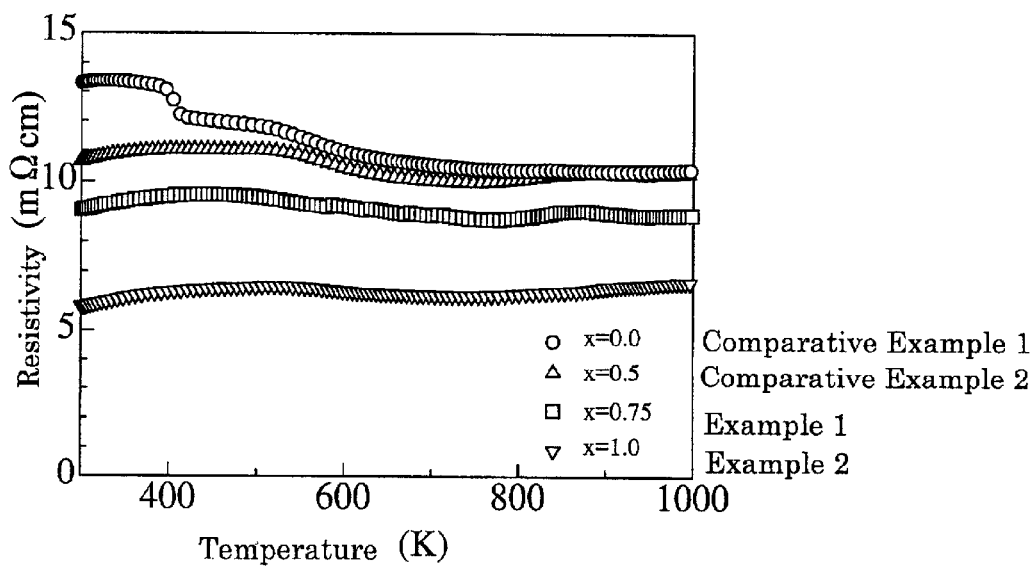
FIG. 7 is a graph showing temperature dependence of resistivity, at high temperatures, of thermoelectric conversion materials produced in accordance with Examples and Comparative Examples of the present invention.

As shown in FIGS. 6 and 7, the samples of Examples 1 and 2 exhibited, both at low temperatures and high temperatures, a resistivity lower than that of the sample of Comparative Example 1 formed of conventional $Ca_3Co_4O_9$. Particularly, the resistivity at high temperatures of the sample of Example 2 (x=1.0) was found to be approximately ½ that of the sample of Comparative Example 1.

Test Example 4

Figure 8:
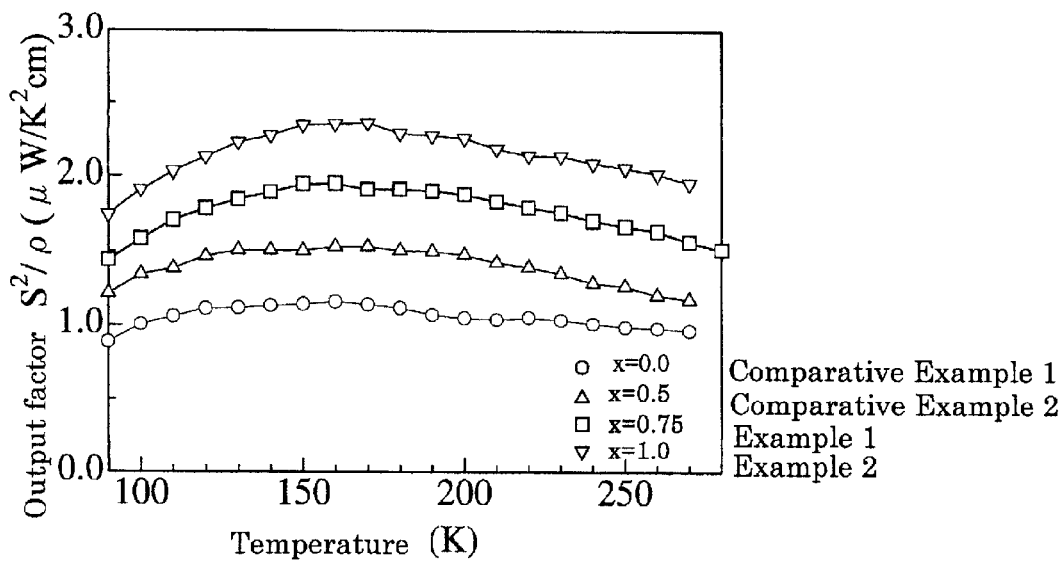
FIG. 8 is a graph showing temperature dependence of output factor, at low temperatures, of thermoelectric conversion materials produced in accordance with Examples and Comparative Examples of the present invention.
Figure 9:
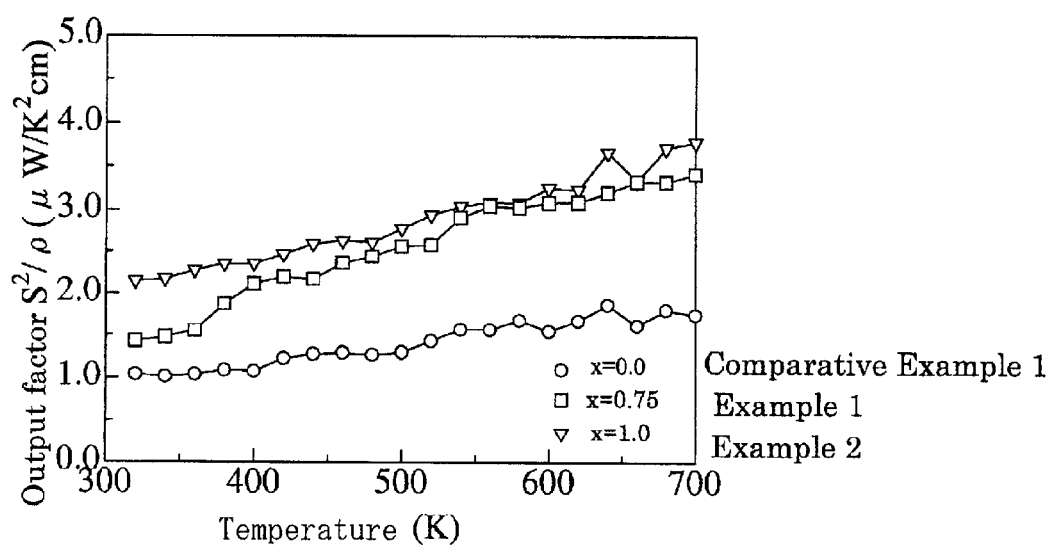
FIG. 9 is a graph showing temperature dependence of output factor, at high temperatures, of thermoelectric conversion materials produced in accordance with Examples and Comparative Examples of the present invention.

Dependence of output factor on temperature of each of the sintered products of Examples 1 and 2 and Comparative Examples 1 and 2 was measured. FIGS. 8 and 9 shows the results. The output factor was calculated by the formula: $P=S^2/\rho$. (S represents Seebeck coefficient.)

The samples of Examples 1 and 2 exhibited, both at low temperatures and high temperatures, an output factor higher than that of the sample of Comparative Example 1 formed of conventional $Ca_3Co_4O_9$. The Seebeck coefficient and resistivity of the sample of Example 2 (x=1.0) were remarkably enhanced, and the maximum output factor was found to be 3.8 $\mu W/K^2 cm$ at 700K.

As described hereinabove, the present invention provides a thermoelectric conversion material which is low toxic and can be used at a high temperature of 500° C. or higher without variation in performance, and a thermoelectric conversion device containing the material.

What is claimed is:

1. A thermoelectric conversion material formed of an oxide represented by $(Ca_{3-x}M_x)Co_4O_9$(M: Sr or Ba, 1.2>x>0.5).

2. A thermoelectric conversion material according to claim 1, wherein the oxide is oriented along the C axis.

3. A thermoelectric conversion device containing a thermoelectric conversion material as recited in claim 2.

4. A thermoelectric conversion device containing a thermoelectric conversion material as recited in claim 1.

* * * * *